(12) United States Patent
Gallo

(10) Patent No.: US 6,434,294 B1
(45) Date of Patent: Aug. 13, 2002

(54) PHOTONIC LOCAL OSCILLATOR SIGNAL GENERATOR AND METHOD FOR GENERATING A LOCAL OSCILLATOR SIGNAL

(75) Inventor: John T. Gallo, Lansdale, PA (US)

(73) Assignee: BAE Systems Aerospace Electronics Inc., Lansdale, PA (US)

( * ) Notice: Subject to any disclaimer, the term of this patent is extended or adjusted under 35 U.S.C. 154(b) by 0 days.

(21) Appl. No.: 09/145,908

(22) Filed: Sep. 2, 1998

(51) Int. Cl.[7] .................................................. G02B 6/34
(52) U.S. Cl. .............................. 385/27; 385/12; 385/15; 385/28; 385/30; 372/20; 372/64
(58) Field of Search ............................. 385/1–6, 8, 14, 385/12, 27, 37, 45, 15, 129, 28, 132, 30; 372/18–20, 22–23, 28, 64, 97–99

(56) References Cited

U.S. PATENT DOCUMENTS

| | | | |
|---|---|---|---|
| 4,878,724 A | * 11/1989 | Thaniyavarn | 385/3 |
| 5,206,925 A | 4/1993 | Nakazawa et al. | 385/142 |
| 5,278,925 A | * 1/1994 | Boysel et al. | 385/14 |
| 5,282,260 A | 1/1994 | Buchal et al. | 385/142 |
| 5,311,540 A | * 5/1994 | Pocholle et al. | 385/3 |
| 5,317,576 A | 5/1994 | Leonberger et al. | 372/6 |
| 5,321,718 A | 6/1994 | Waarts et al. | 372/108 |
| 5,394,489 A | 2/1995 | Koch | 385/14 |
| 5,513,196 A | * 4/1996 | Bischel et al. | 372/22 |
| 5,677,769 A | 10/1997 | Bendett | 356/440 |
| 6,041,071 A | * 3/2000 | Tayebati | 372/64 |

\* cited by examiner

Primary Examiner—Frank G. Font
Assistant Examiner—Sang H. Nguyen
(74) Attorney, Agent, or Firm—Drinker Biddle & Reath LLP

(57) ABSTRACT

The present invention provides a photonic local oscillator signal generator. The generator includes a plurality of waveguides fabricated in a single substrate. The waveguides are fabricated with a lateral separation that enables an evanescent tail of an optical mode field generated in one waveguide to overlap with an evanescent tail of an optical mode field generated in an adjacent waveguide. The overlap of the evanescent tails produce cross-coupling between the laser light generated in the adjacent waveguides. The generator uses a common pumping element to pump laser cavities of both of the waveguides. The use of a common pumping element and the cross-coupling produces phase locking between the laser light generated in the plurality of waveguides. As a result of the phase locking, mutual optical coherence between the laser light is achieved. The mutual optical coherence provides an interference signal upon photodetection. This interference signal is the offset between the center frequency of the laser light produced in the adjacent waveguides and serves as the local oscillator signal.

23 Claims, 3 Drawing Sheets

PHOTONIC LOCAL OSCILLATOR SIGNAL GENERATOR AND METHOD FOR GENERATING A LOCAL OSCILLATOR SIGNAL

FIELD OF THE INVENTION

The present invention relates to local oscillator signal generators and generation of local oscillator signals. More particularly, the present invention relates to a photonic local oscillator generator and the generation of a local oscillator signal therefrom in the microwave frequency band and higher.

BACKGROUND OF THE INVENTION

Traditional frequency synthesis electronics are not adequate for generation of microwave and higher frequency local oscillator signals. Presently, high frequency stable electrical signals from local oscillators are obtained by multiplying a low-frequency reference (e.g., quartz oscillator) to the required high frequency, for example, 32 GHz, with several stages of multipliers and amplifiers. The resulting system is bulky, complicated, inefficient, presents high phase noise, and is costly.

Typical systems require the generation of multiple local oscillator signals followed by distribution of the signals to various points throughout an electronics rack. The cabling required for this distribution presents high loss and distortion for the local oscillator frequencies in the microwave and higher frequency bands. This often requires the duplication of costly frequency synthesis hardware at multiple points in the system. Alternate local oscillator signal generating proposals require complex frequency-locking and phase-locking electronics systems to preserve signal integrity.

Photonic generation of local oscillator signals provides improved spectral purity of the generated signal. Photonic generation is capable of producing local oscillator signals up to several Terahertz in frequency. While capable of producing these high frequency local oscillator signals, the known techniques for generating these signals produce unstable signals and require external electronic feedback loops to stabilize the generated signals.

SUMMARY OF THE INVENTION

The present invention is a photonic local oscillator signal generator which includes a plurality of parallel optical channel waveguides fabricated in a single substrate such that an evanescent tail of an optical mode field created by laser light generation in each of the plurality of waveguides overlaps with an evanescent tail of an optical mode field created by laser light generation in an adjacent waveguide. The generator also includes a pan-chromatic mirror attached to an end of the substrate. The plurality of waveguides is fabricated within the substrate such that the pan-chromatic mirror delimits one end of a laser cavity of each of the plurality of waveguides. The generator also includes a Bragg grating mirror which has a plurality of grating fringes. The grating mirror delimits a second end of the laser cavity of each of the plurality of waveguides. The grating fringes are spaced apart from each other and traverse the plurality of waveguides such that the spacing between the grating fringes, as the grating fringes traverse each of the plurality of waveguides, is different.

A local oscillator signal is generated by pumping the plurality of optical channel waveguides with a single pumping means, generating an optical mode field in the laser cavity of each of the plurality of waveguides, each of the optical mode fields having a unique center frequency, phase locking the optical mode field of adjacent ones of the plurality of waveguides, and photodetecting an interference signal resultant from the phase locking of the adjacent optical mode fields.

The present invention provides a local oscillator signal generator for generating local oscillator signals ranging in frequency from a few megahertz to several terahertz.

The present invention also provides a local oscillator signal generator with improved resistance to environmental variations.

The present invention further provides a local oscillator signal generator that generates highly stable signals.

DESCRIPTION OF THE INVENTION

Figure 1:
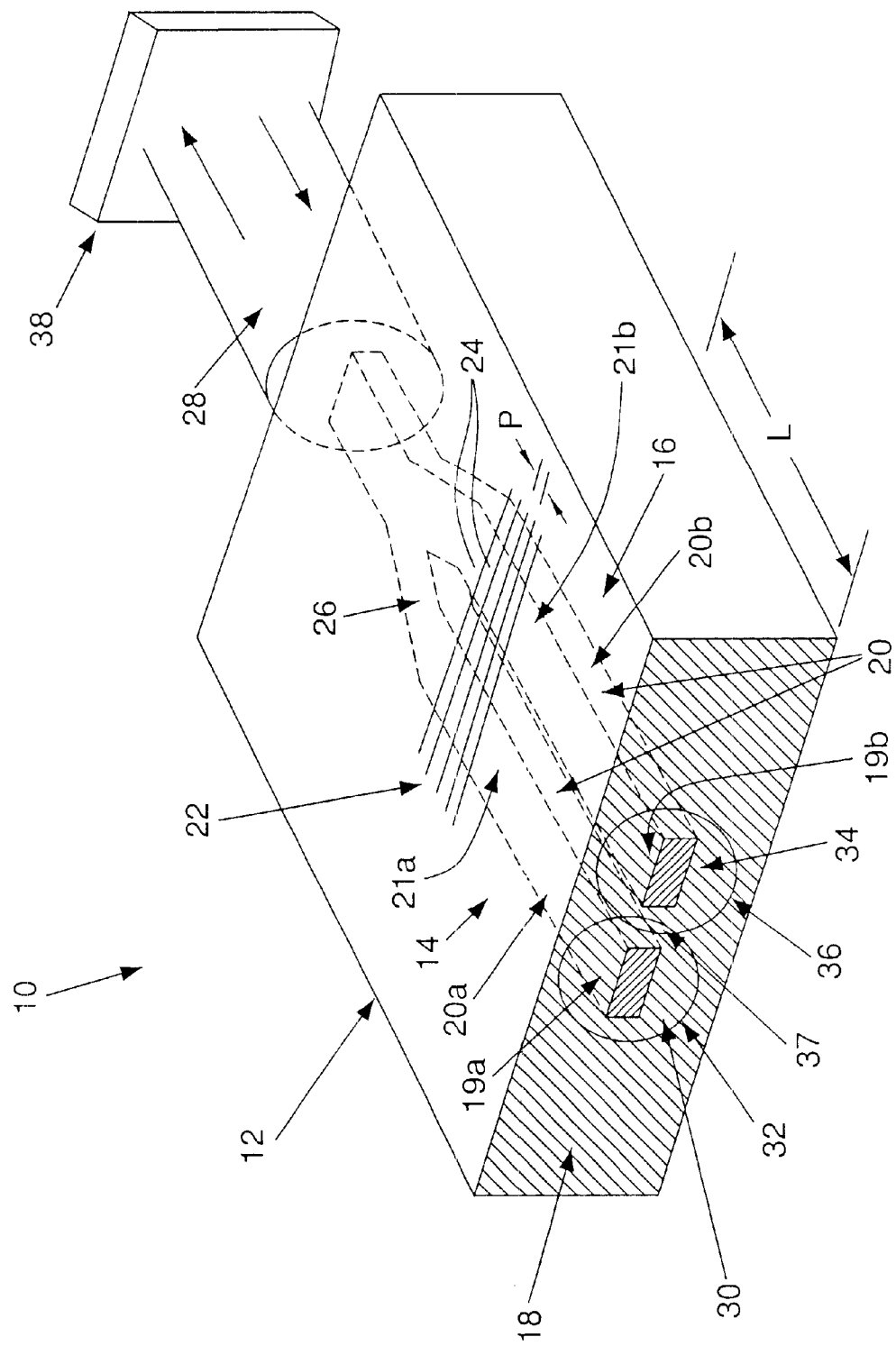
FIG. 1 is a perspective view of a photonic local oscillator signal generator of the present invention.

In the drawings, where like numerals identify like elements, there is shown a local oscillator signal generator generally designated by the numeral 10. The generator 10 illustrated in FIG. 1 includes a substrate 12 and at least two optical channel waveguides 14, 16 fabricated in the substrate 12. The waveguides 14,16 are typically fabricated by doping the substrate 12 with rare earth ions such as erbium, ytterbium, or neodymium. The substrate 12 may also be any optical waveguide material including semiconductor, lithium niobate, glass, or optical polymer. The waveguides 14, 16 are fabricated parallel to each other in the substrate 12.

The generator 10 also includes a pan-chromatic mirror 18. The pan-chromatic mirror 18 is attached to one side of the substrate 12 and forms or delimits a first end 19a, 19b of a laser cavity 20a, 20b of each of the waveguides 14, 16. The pan-chromatic mirror 18 effectively reflects all wavelengths of light equally. A second end 21a, 21b of each of the laser cavities 20a, 20b, opposite to the first end 19a, 19b of the laser cavity 20a, 20b, is delimited by a Bragg grating mirror 22. The laser cavity 20a, 20b for each of the waveguides 14, 16 therefore has a length L that is equal to the distance between the pan-chromatic mirror 18 and the Bragg grating mirror 22. The length L of each of the laser cavities 20a, 20b is one of the parameters that determines the wavelength/frequency of light generated in a particular laser cavity, as discussed in more detail below.

The Bragg grating mirror 22 includes a plurality of grating fringes 24. The grating fringes 24 traverse each of the waveguides 14, 16. The grating fringes 24 are spaced apart from each other by an amount P. Furthermore, the grating fringes 24 are arranged in a fanned configuration. That is, as the grating fringes 24 traverse the waveguides 14, 16 the spacing P between the grating fringes 24 will change and will be different for each of the waveguides 14, 16. This results in a different center frequency or wavelength for the laser light generated in each of the waveguides 14, 16. The difference between the center frequency/wavelength is based upon the rate of the grating fan-out and the lateral separation between the waveguides 14, 16. This is based on simple trigonometry. As the rate of grating fan-out is increased, the greater the separation between center frequencies for adjacent waveguides. Additionally, as the lateral separation between adjacent waveguides increases so will the difference between center frequencies. The center frequency of the waveguides may be tuned by modifying the refractive index of the grating area of the waveguides 14, 16. The refractive index may be changed by using any one of well-known techniques including thermal-optic, electro-optic, acoustic-optic or optical-optic effects.

Figure 2A:
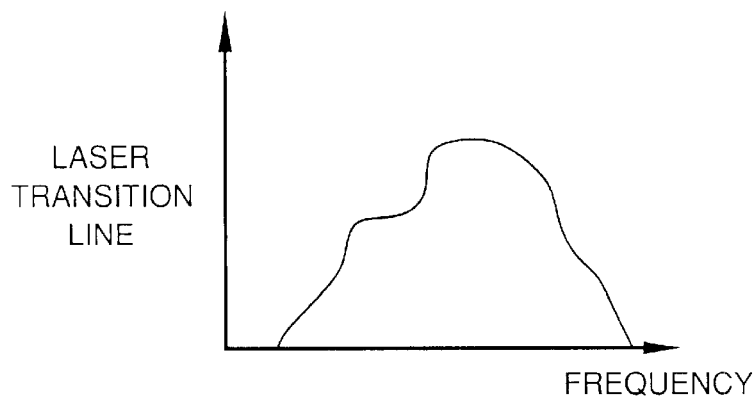
FIGS. 2(a)–2(d) are graphs representing laser light frequencies producible by the generator of FIG. 1.
Figure 2B:
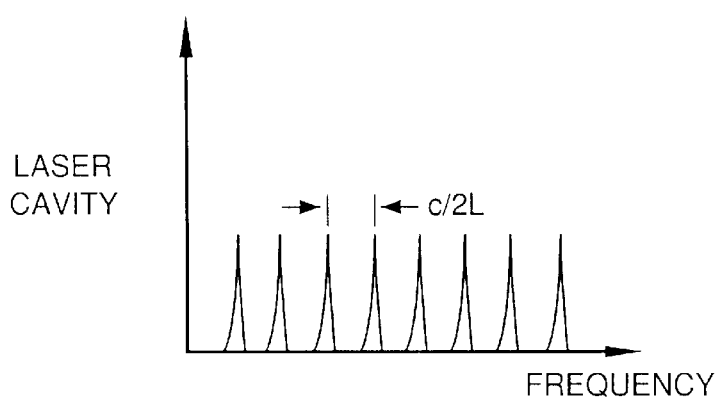

The output frequency/wavelength of an optical waveguide is defined by a combination of the laser transition line of the gain medium, i.e., material within the laser cavity, laser cavity resonance condition, and laser cavity mirror reflectivity. FIG. 2 illustrates the role each of these individual factors plays and the resultant laser spectra that result from the combined effect of these factors. The laser transition line spectrum is defined by the dopant and substrate materials. This spectrum, as shown in FIG. 2(a), defines the complete range of optical frequencies the laser waveguide is capable of generating. The laser cavity 20 is that part of a waveguide that is capable of resonantly accumulating optical gain, i.e., located between the pan-chromatic mirror 18 and the grating mirror 22. The length L of the laser cavity 20 determines the allowable optical field modes. The laser cavity can produce laser light of multiple frequencies separated by c/2L. These frequencies define the available modes that can be produced in the laser cavities. In this formulation "c" is the speed of light. These discrete modes are illustrated in FIG. 2(b). The combination of the transition line and cavity spectra reveals that there is a finite range of discrete laser frequencies that the laser can generate.

Figure 2C:
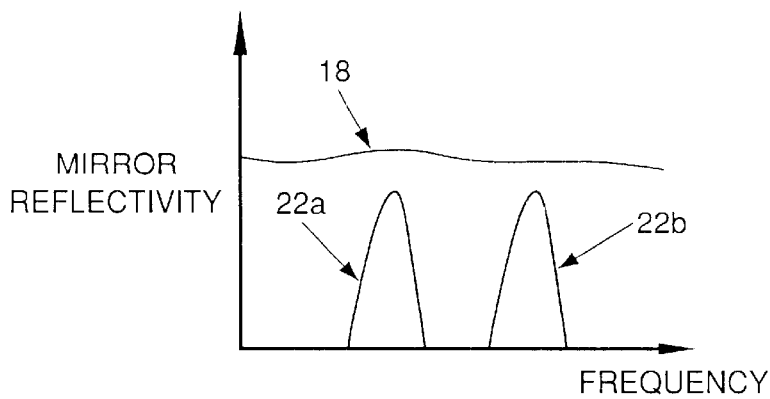
Figure 2D:
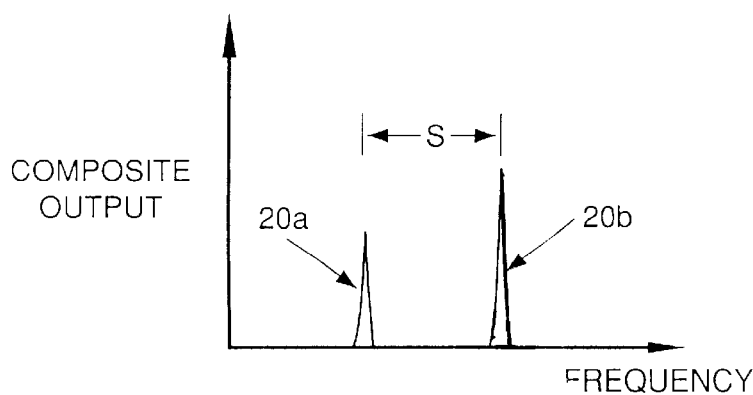

Selection of single frequencies from among the several that can be generated from the cavity 20 is achieved by using a mirror or mirrors that reflect light only in very narrow frequency bands. FIG. 2(c) illustrates a graph showing the pan-chromatic mirror 18 as reflecting all optical frequencies substantially identically. FIG. 2(c) also illustrates the frequency bands for the Bragg grating mirror 22 for the waveguides 14, 16. These bands are the results of the preselected intersection of the Bragg mirror 22 and the waveguides 14, 16. The Bragg mirror 22 is highly frequency selective and allows only a single optical mode to exist in each laser cavity 20. By fanning the grating fringes 24, it is assured that the frequency for the laser light generated in each laser cavity is different without limiting the offset, S, between the frequencies of laser light generated in each laser cavity 20. As discussed above, the center frequency of the grating mirror 22 for each of the waveguides 14, 16 may be adjusted or tuned by modifying the refractive index of the grating area. The offset, S, between the frequency of laser light generated in adjacent laser cavities 20 will be the local oscillator signal generated upon photodetection of the combined waveguide signals. As discussed below, the local oscillator signal is equal to the heterodyne beat frequency or beat signal resulting from the interference of the laser light generated in adjacent laser cavities 20. FIG. 2(d) illustrates the composite frequency spectrum of the output signal of the waveguides of the local oscillator generator 10. As illustrated in FIG. 2(d), laser light having a unique center frequency is generated in each laser cavity 20a, 20b.

The waveguides 14, 16 must be located within the substrate 12 to enable the evanescent tail of the optical mode field generated in each of the laser cavities to overlap with the evanescent tail of the optical mode field generated in an adjacent laser cavity. The size of the optical mode field and the concomitant evanescent tail is a function of the frequency/wavelength of the laser light generated in the laser cavity 20. Therefore, the lateral separation between the waveguides 14, 16 is a function of the frequency/wavelength of the laser light generated in the laser cavities 20. As a result, the desired center frequency or range of center frequencies for tunable devices for each waveguide 14, 16 must be preselected prior to fabrication. Once the center frequency for each waveguide 14, 16 has been preselected, the lateral spacing between adjacent waveguides can be determined based upon the optical mode field generated by the preselected center frequency.

The generator 10 includes an optical combiner/splitter 26 that couples the waveguides 14, 16. The generator 10 may also include an optical fiber 28. The optical fiber 28 couples light from a pumping element (not shown) to the optical combiner/splitter 26 and into the waveguides 14, 16. The pump light excites the gain medium i.e., the material of each of the laser cavities 20a, 20b, to generate laser light. Pumping both the waveguides 14, 16 with the same pump element promotes phase locking of the laser light generated in the waveguides 14, 16. This process is commonly known as injection-locking. As the pumping element supplies pumping light to the laser cavities 20a, 20b, they generate laser light. An optical mode field is created for each laser cavity 20 upon the generation of the laser light. Each optical mode field includes an evanescent tail. The optical mode field created within one of the waveguides 14 includes an evanescent tail 30 that occupies the space delimited by circle 32 along the laser cavity 20a. The optical mode field created within another one of the waveguides 16 includes an evanescent tail 34 that occupies the space delimited by circle 36 along the laser cavity 20b. The evanescent tail 30 of one waveguide 14 overlaps with the evanescent tail 34 of another waveguide 16 in the area 37 defined by the overlap of circle 32 and circle 36 along the laser cavities 20a, 20b. This overlap enables cross-coupling between the laser cavities 20a, 20b. The cross-coupling between the laser cavities 20a, 20b produces mutual optical coherence between the laser light generated in one waveguide 14 and the laser light generated in the other waveguide 16.

The size of the evanescent tail generated by each of the waveguides 14, 16 is dependent upon a variety of factors, including the substrate material, the center frequency selected and the pumping light. These factors are well known to those skilled in the art. Once the waveguide parameters have been selected and determined, the size of the evanescent tail for each of the waveguides can be determined. Once the size of the evanescent tail is determined, the spacing between the waveguides in the substrate can be determined. As discussed above, the waveguides should be spaced to allow overlap of adjacent evanescent tails.

Each waveguide produces self-coherent laser light. Typically, laser light generated in two different waveguides will not be mutually coherent. In order for mutual optical coherence to occur between laser light generated in different waveguides, additional circumstances need to be present. These may include evanescent tail cross-coupling of the waveguides and pumping of both laser cavities with a common pumping element. When mutual optical coherence is obtained, it causes interference between the laser light of different wavelengths generated in the waveguides 14, 16 upon photodetection. In contrast to two incoherent laser beams, which generate two independent signals when photodetected (because there is no interference between them), two coherent laser beams produce three signals when photodetected: two signals that are independent and correspond to the incoherent case, and a third signal at a frequency equal to the offset, S, between the center frequencies of the two, mutually coherent beams. The third signal is commonly referred to as the heterodyne beat frequency or beat signal.

Once the laser cavities 20a, 20b generate the laser light, the laser light is output through the optical combiner/splitter 26 to the optical fiber 28 and fed to a photodetector 38.

Locating the waveguides 14, 16 in a single substrate reduces the effect of environmental variations. For example, if the refractive index of the entire substrate changes, then any center frequency drift that results in one waveguide will also occur in the other waveguide. This, in turn, preserves the offset frequency between the two waveguides.

By fabricating additional waveguides in the substrate additional local oscillator signals may be generated from a single generator. Due to waveguide properties, if all of the adjacent waveguides have overlapping evanescent tails, once light generated in two of the waveguides is mutually optically coherent than cross coupling will be present between all adjacent waveguides and light generated in all of the waveguides will be mutually optically coherent. This commutation extends to any number of waveguides so long as each adjacent pair is mutually optically coherent.

Figure 3:
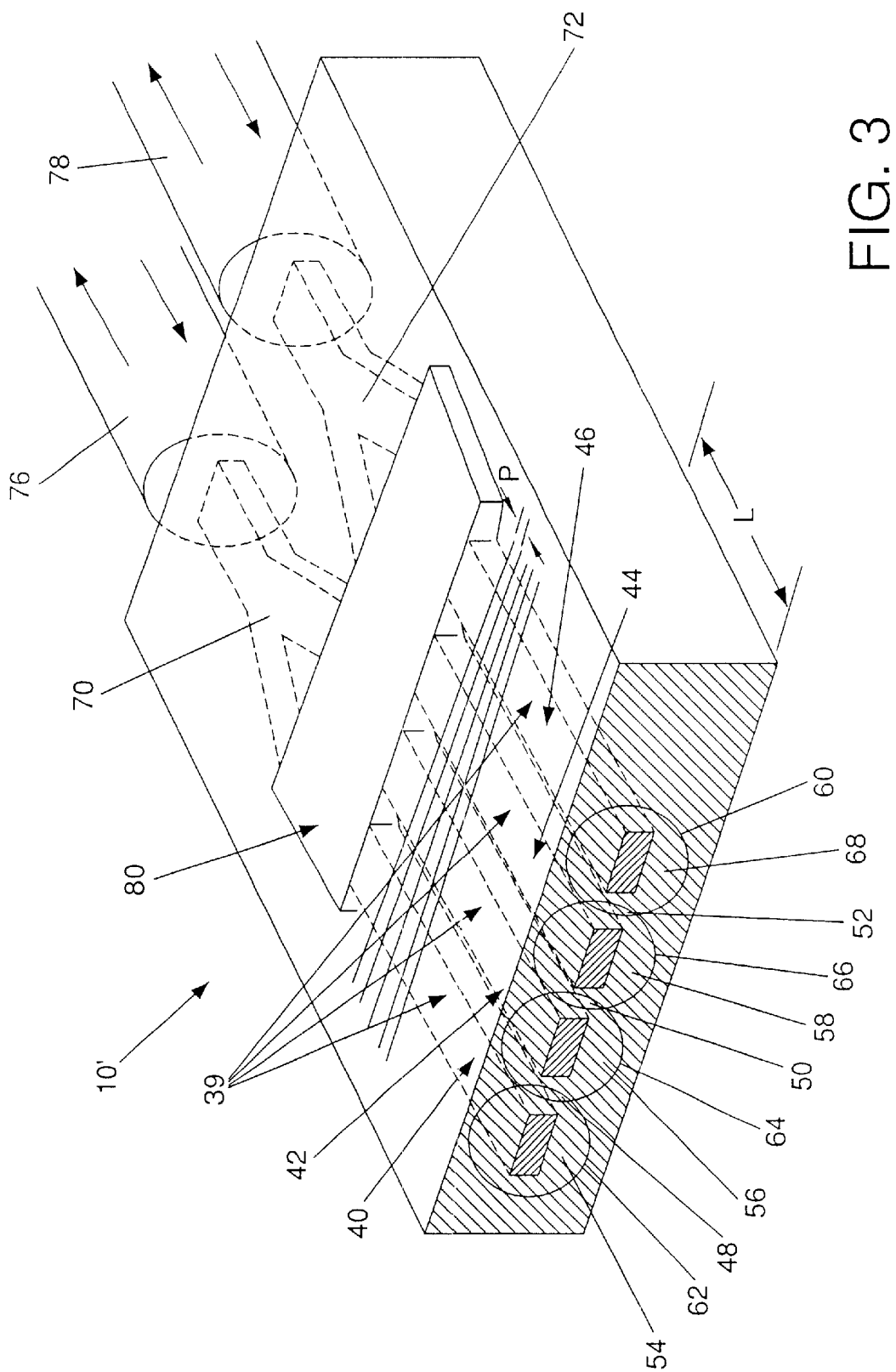
FIG. 3 is a perspective view of another embodiment of a photonic local oscillator signal generator of the present invention.

An alternate embodiment, illustrated in FIG. 3, implements an example of such a generator. The generator 10' includes an array of waveguides 39. In this embodiment the generator 10' has four waveguides 40, 42, 44, and 46. The number of waveguides fabricated in the substrate is limited only by available technology and economic concerns. Each of the waveguides 40, 42, 44, and 46 is fabricated and positioned in accordance with the description of the embodiment illustrated in FIG. 1. The waveguides 40, 42, 44, and 46 are mutually optically coherent due to the evanescent tail coupling between the adjacent waveguides as illustrated by the overlap 48, 50, and 52 of the evanescent tails 54, 56, 58, and 60 of the waveguides 40, 42, 44, and 46, respectively, as delimited by circles 62, 64, 66, and 68, respectively. The generator 10' also includes two optical combiner/splitters 70, 72 that couple pumping light into each of the waveguides 40, 42, 44, and 46 and couple generated laser light to the optical fibers 76, 78 or a pair of photodetectors (not shown). The generator 10' also includes a cross-connect switch 80 (also known as an optical space switch) that selectively couples generated laser light from any one of the four waveguides, for example 42, into one leg of one of the optical combiners, for example 70, and couples generated laser light from another one of the four waveguides, for example 46, into the other leg of the same optical combiner, for example, 70. This enables the generator 10' to generate multiple local oscillator signals (one from each combiner/splitter) having a variety of center frequencies by selecting two waveguides, for example 40 and 42 or 42 and 46, wherein each generated local oscillator signal will have a frequency equal to the offset between the center frequencies of the selected waveguides. The generator may have as many combiner/splitters as is necessary and practical to produce as many local oscillator frequencies as desired.

The switch 80 and the optical combiner/splitters 70, 72 may be integrated with the generator 10' or may be discrete elements.

The present invention may be embodied in other specific forms without departing from the spirit or essential attributes thereof and, accordingly, reference should be made to the appended claims, rather than to the foregoing specification, as indicating the scope of the invention.

What is claimed is:

1. A photonic local oscillator signal generator comprising:
   a substrate;
   a plurality of optical channel waveguides fabricated in the substrate;
   a pan-chromatic mirror attached to the substrate delimiting a first end of a laser cavity of each of the plurality of waveguides; and
   a Bragg grating mirror delimiting a second end of the laser cavity of each of the plurality of waveguides, the grating mirror including a plurality of grating fringes, the spacing between the grating fringes being different for each of the plurality of waveguides;
   wherein the plurality of waveguides are fabricated such that in operation of the signal generator an evanescent tail of an optical mode field created by laser light generation in each of the plurality of laser cavities overlaps with an evanescent tail of an optical mode field created by laser light generation in an adjacent laser cavity.

2. A photonic local oscillator signal generator as recited in claim 1, wherein the spacing between each of the plurality of grating fringes varies linearly as the grating fringes traverse the plurality of waveguides.

3. A photonic local oscillator signal generator as recited in claim 1, wherein the plurality of waveguides are fabricated parallel to each other.

4. A photonic local oscillator signal generator as recited in claim 1, further comprising a cross-connect switch connected to each of the plurality of waveguides.

5. A photonic local oscillator signal generator as recited in claim 1, further comprising a single pumping means for pumping the plurality of waveguides.

6. A photonic local oscillator signal generator comprising:
   a substrate;
   a plurality of optical channel waveguides fabricated in the substrate, the plurality of optical channel waveguides fabricated parallel to each other such that an evanescent tail of an optical mode field created by laser light generation in each of the plurality of waveguides overlaps with an evanescent tail of an optical mode field created by laser light generation in an adjacent waveguide;
   a pan-chromatic mirror attached to the substrate delimiting a first end of a laser cavity of each of the plurality of optical channel waveguides; and
   a Bragg grating mirror delimiting a second end of the laser cavity of each of the plurality of optical channel waveguides, wherein the Bragg grating mirror includes a plurality of grating fringes, the grating fringes being distinctly spaced from each other as they traverse the plurality of waveguides.

7. A photonic local oscillator signal generator as recited in claim 6, wherein the spacing between each of the plurality of grating fringes varies linearly as the grating fringes traverse the plurality of waveguides.

8. A photonic local oscillator signal generator as recited in claim 6, further comprising a cross-connect switch connected to each of the plurality of waveguides.

9. A photonic local oscillator signal generator as recited in claim 6, further comprising a single pumping means for pumping the plurality of optical channel waveguides.

10. A photonic local oscillator signal generator comprising:
    a substrate;
    a plurality of optical channel waveguides fabricated in the substrate;

a pan-chromatic mirror attached to the substrate delimiting a first end of a laser cavity of each of the plurality of optical channel waveguides;

a Bragg grating mirror delimiting a second end of the laser cavity of each of the plurality of optical channel waveguides; and a single pumping means for pumping each of the plurality of optical channel waveguides;

each of the plurality of laser cavities generating laser light having a unique center frequency when pumped; and an optical mode field being associated with the laser light in each of the plurality of laser cavities, each optical mode field having an evanescent tail which overlaps with the evanescent tail of the adjacent optical mode field.

11. A photonic local oscillator signal generator as recited in claim 10, wherein the grating mirror includes a plurality of grating fringes, the grating fringes spaced from each other and traversing the plurality of waveguides such that the spacing between the grating fringes for each of the plurality of waveguides is different.

12. A photonic local oscillator signal generator as recited in claim 11, wherein spacing between each of the plurality of grating fringes varies linearly as the grating fringes traverse the plurality of waveguides.

13. A photonic local oscillator signal generator as recited in claim 11, wherein the signal generated by the overlap of adjacent evanescent tails is equal to a difference between the center frequency of the adjacent laser cavities.

14. A photonic local oscillator signal generator as recited in claim 10, wherein the plurality of optical channel waveguides are fabricated parallel to each other.

15. A photonic local oscillator signal generator as recited in claim 10, further comprising a photodetector for detecting a signal generated by the overlap of adjacent evanescent tails.

16. A photonic local oscillator signal produced by the steps of:

generating laser light in a first optical channel waveguide and a concomitant first mode field, the first optical channel waveguide laser light having a first center frequency, and the first mode field including an evanescent tail;

generating laser light in a second optical channel waveguide and a concomitant second mode field, the second optical channel waveguide laser light having a second center frequency different from said first center frequency, and the second mode field including an evanescent tail, the second optical channel waveguide positioned relative to the first optical channel waveguide such that the first mode field evanescent tail and the second mode field evanescent tail overlap; and generating from the laser light a signal having a frequency equal to the difference between the first center frequency and the second center frequency.

17. A photonic local oscillator signal as recited in claim 16, wherein overlapping the first mode field evanescent tail and the second mode field evanescent tail produces cross-coupling between the first and second optical channel waveguides.

18. A photonic local oscillator signal as recited in claim 17, wherein the cross-coupling between the first and second optical channel waveguides produces optical coherence between the laser light generated in the first optical channel waveguide and the laser light generated in the second optical channel waveguide.

19. A photonic local oscillator signal as recited in claim 16, further comprising the step of detecting a signal equal to the difference between the first center frequency and the second center frequency.

20. A method of making a photonic local oscillator signal generator, comprising the steps of:

fabricating a plurality of parallel optical channel waveguides in a substrate;

attaching a mirror to the substrate thereby delimiting a first end of a laser cavity within each of the plurality of waveguides;

incorporating a Bragg grating mirror in the substrate thereby delimiting a second end of the laser cavity of each of the plurality of waveguides, the grating mirror traversing each of the plurality of waveguides and including a plurality of grating fringes;

spacing the grating fringes from each other such that the spacing between the grating fringes across each of the plurality of the waveguides is different; and positioning the plurality of waveguides relative to each other such that an evanescent tail of an optical mode field created by laser light generation in each of the plurality of laser cavities overlaps an evanescent tail of an optical mode field created by laser light generation in an adjacent laser cavity.

21. A method of making a photonic local oscillator signal generator, comprising the steps of:

fabricating a plurality of parallel optical channel waveguides in a substrate;

attaching a mirror to the substrate thereby delimiting a first end of a laser cavity within each of the plurality of waveguides;

incorporating a Bragg grating mirror in the substrate thereby delimiting a second end of the laser cavity of each of the plurality of waveguides, each of the plurality of laser cavities generating laser light having a unique center frequency when pumped, the grating mirror traversing each of the plurality of waveguides and including a plurality of grating fringes; and positioning the plurality of waveguides relative to each other such that an evanescent tail of an optical mode field created by laser light generation in each of the plurality of laser cavities overlaps an evanescent tail of an optical mode field created by laser light generation in an adjacent laser cavity.

22. A method of making a photonic local oscillator signal generator as recited in claim 21, further comprising the step of spacing the grating fringes from each other such that the spacing between the grating fringes across each of the plurality of the waveguides is different.

23. A method of generating a photonic local oscillator signal, comprising the steps of:

pumping a plurality of optical channel waveguides with a single pumping means;

generating an optical mode field in a laser cavity of each of the plurality of waveguides, each optical mode field having a unique center frequency;

phase locking the optical mode field of adjacent ones of the plurality of waveguides;

photodetecting an interference signal resultant from the phase locking of the adjacent optical mode fields.

* * * * *